US010054856B2

(12) United States Patent
Matsunaga et al.

(10) Patent No.: US 10,054,856 B2
(45) Date of Patent: Aug. 21, 2018

(54) EXPOSURE METHOD, MANUFACTURING METHOD OF DEVICE, AND THIN FILM SHEET (71) Applicant: Toshiba Memory Corporation, Minato-ku (JP)

(72) Inventors: Kentaro Matsunaga, Yokkaichi (JP); Kazuhiro Segawa, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 261 days.

(21) Appl. No.: 14/692,925

(22) Filed: Apr. 22, 2015

(65) Prior Publication Data
US 2016/0240423 A1  Aug. 18, 2016

Related U.S. Application Data (60) Provisional application No. 62/115,428, filed on Feb. 12, 2015.

(51) Int. Cl.
*H01L 21/302* (2006.01)
*G03F 7/26* (2006.01)
*H01L 21/324* (2006.01)
*H01L 21/683* (2006.01)
*G03F 7/20* (2006.01)
*H01L 21/66* (2006.01)

(52) U.S. Cl.
CPC ............ *G03F 7/26* (2013.01); *G03F 7/70783* (2013.01); *H01L 21/3247* (2013.01); *H01L 21/6838* (2013.01); *H01L 22/12* (2013.01)

(58) Field of Classification Search
CPC ............... G03F 7/2002; G03F 7/70783; H01L 21/6838; H01L 21/3247
USPC ......................................................... 430/319
See application file for complete search history.

(56) References Cited

U.S. PATENT DOCUMENTS

2014/0191524 A1* 7/2014 Gracias ................. B81B 3/0024
294/192

FOREIGN PATENT DOCUMENTS

| JP | 11-238710 | 8/1999 |
|---|---|---|
| JP | 2001-110477 | 4/2001 |
| JP | 2009-054965 | 3/2009 |
| JP | 2010-209158 | 9/2010 |
| JP | 2013-172039 | 9/2013 |

* cited by examiner

*Primary Examiner* — Daborah Chacko Davis
(74) *Attorney, Agent, or Firm* — Oblon, McClelland, Maier & Neustadt, L.L.P.

(57) ABSTRACT

According to one embodiment, there is provided an exposure method. The method includes attaching a thin film sheet thermally shrinkable onto a rear face of a wafer. The method includes heating the wafer provided with the thin film sheet attached thereon, and deforming the wafer into a shape projecting on a front face side of the wafer. The method includes fixing the deformed wafer onto a stage by vacuum suction holding from a rear face side of the wafer. The method includes performing exposure to the fixed wafer.

11 Claims, 8 Drawing Sheets

EXPOSURE METHOD, MANUFACTURING METHOD OF DEVICE, AND THIN FILM SHEET

CROSS-REFERENCE TO RELATED APPLICATIONS

This application is based upon and claims the benefit of priority from U.S. Provisional Application No. 62/115,428, filed on Feb. 12, 2015; the entire contents of which are incorporated herein by reference.

FIELD

Embodiments described herein relate generally to an exposure method, a manufacturing method of a device, and a thin film sheet.

BACKGROUND

In a process for manufacturing a semiconductor device, exposure is performed to a wafer, and a predetermined pattern is thereby formed on the wafer. At this time, it is desirable that the wafer should be properly fixed on a stage.

DETAILED DESCRIPTION

In general, according to one embodiment, there is provided an exposure method. The method includes attaching a thin film sheet thermally shrinkable onto a rear face of a wafer. The method includes heating the wafer provided with the thin film sheet attached thereon, and deforming the wafer into a shape projecting on a front face side of the wafer. The method includes fixing the deformed wafer onto a stage by vacuum suction holding from a rear face side of the wafer. The method includes performing exposure to the fixed wafer.

Exemplary embodiments of an exposure method will be explained below in detail with reference to the accompanying drawings. The present invention is not limited to the following embodiments.

Embodiment

An exposure method according to an embodiment is used in a process for manufacturing a semiconductor device. In processes for manufacturing a semiconductor device, there is a case where a wafer is deformed.

Specifically, in a process for manufacturing a semiconductor device, a predetermined film is formed on a wafer, a resist film is applied to the predetermined film, and an exposure process for transferring a mask pattern onto the resist film is performed, so that a latent image pattern is formed on the resist film. Thereafter, the latent image pattern is developed, and etching is performed by use of the developed pattern as a mask, so that the predetermined film is processed in a fine pattern. At this time, due to the film formation performed onto the wafer and/or the fine pattern process performed onto the predetermined film, stresses are applied to the wafer. Consequently, for example, the wafer is strained toward the front face side, and is thereby warped into a shape such as a saddle shape, so that the wafer is deformed into a shape projecting on its rear face side. For example, the difference between the highest point and the lowest point on the front face of the wafer is about 400 μm, as the case may be.

When a wafer deformed in a shape projecting on the rear face side is mounted on a stage provided with a plurality of vacuum suction holes, the distances between the vacuum suction holes and the wafer are too large, and so the wafer tends to be hardly held in a flat state by vacuum suction. Consequently, when a wafer deformed in a shape projecting on the rear face side is processed, the wafer on a conveyor robot may be positionally shifted and/or fall down, during conveyance of the wafer.

In the case of a film formation process, if a wafer can be hardly held in a flat state, for example, a process gas flow may vary, and the planar uniformity of film formation amount is thereby deteriorated.

In the case of a coating process, if a wafer can be hardly held in a flat state, the planar uniformity of resist solution supply amount on the front face of the wafer may be deteriorated, and the planar uniformity of resist film coating amount is thereby deteriorated.

In the case of an exposure process, if a wafer can be hardly held in a flat state, a mask pattern may be transferred onto the wafer in an improper state, and a proper latent image pattern is thereby difficult to be formed. For example, the difference in height on the front face of the wafer within a shot region exceeds the focus depth of the exposure apparatus, the mask pattern image is difficult to be focused on the front face of the wafer.

In the case of a heat processing treatment (such as a post baking process following the exposure), if a wafer can be hardly held in a flat state, the planar uniformity of thermal history of the wafer may be deteriorated. For example, when a resist film subjected to the exposure is a chemical amplification type resist, the reaction between an acid generated by a photo-acid generating agent and a base resin may be insufficiently promoted, and a latent image pattern in the resist thereby comes into an incomplete state.

In the case of a development process, if a wafer can be hardly held in a flat state, the planar uniformity of supply amount of an alkali developing solution on the front face of the wafer may be deteriorated, and the planar uniformity of development amount is thereby deteriorated.

In this respect, a wafer deformed in a shape projecting on the rear face side has a complicated curved shape in many cases (see FIG. 2B), and so the wafer tends to be hardly reformed into a flat shape. This tendency becomes more prominent, as the diameter of the wafer is larger.

Accordingly, in this embodiment, for example, when a light exposure process is performed, a thin film sheet thermally shrinkable is attached onto the rear face of a wafer and then the wafer is heated, so that the wafer is deformed into a shape projecting on the front face side. Then, the wafer thus deformed is fixed onto a stage by vacuum suction holding from its rear face side, and the wafer is thereby held in a flat state.

Figure 1:
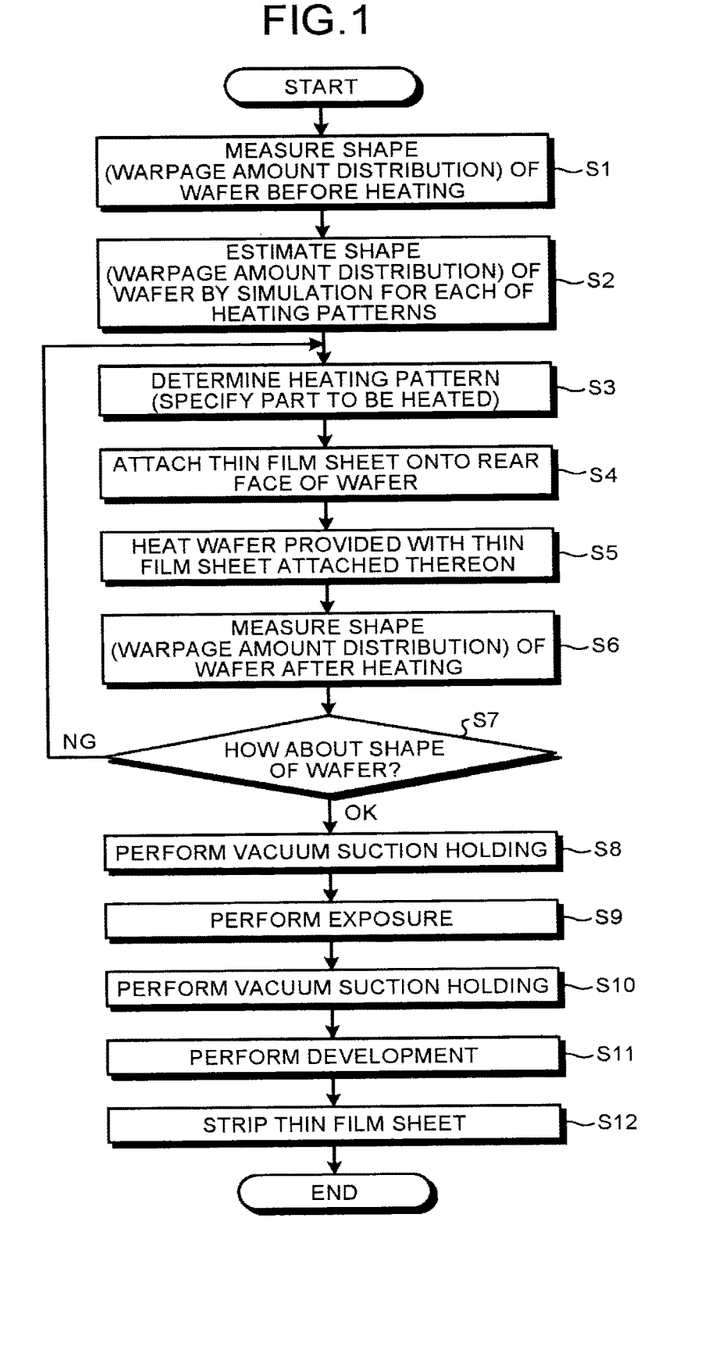
FIG. 1 is a flow chart showing a manufacturing method of a device, which includes an exposure method according to an embodiment.

Specifically, as shown in FIG. 1, an exposure process is performed in accordance with S1 to S9, and then a development process is performed in accordance with S10 and S1. FIG. 1 is a flow chart showing a manufacturing method of a device, which includes an exposure method according to this embodiment.

Figure 2A:
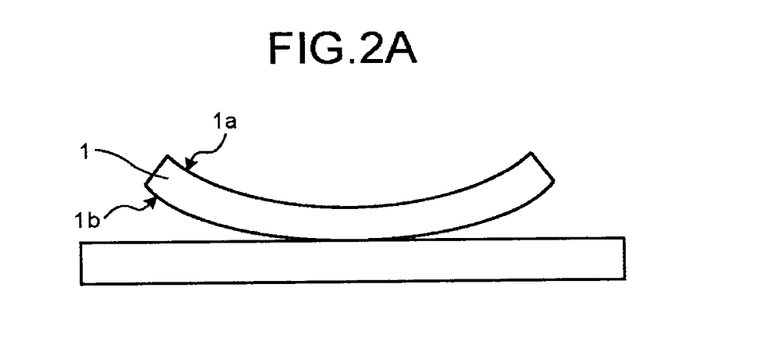
FIG. 2A is a sectional view showing the warpage of a wafer in the embodiment.

In a semiconductor manufacturing process, for example, as shown in FIG. 2A, a wafer 1 is deformed in a shape projecting on its rear face 1b side. At this time, a predetermined film formed (not shown) is present on its front face 1a and a resist film applied (not shown) is present on the predetermined film. FIG. 2A is a sectional view showing the warpage of the wafer 1.

Figure 2B:
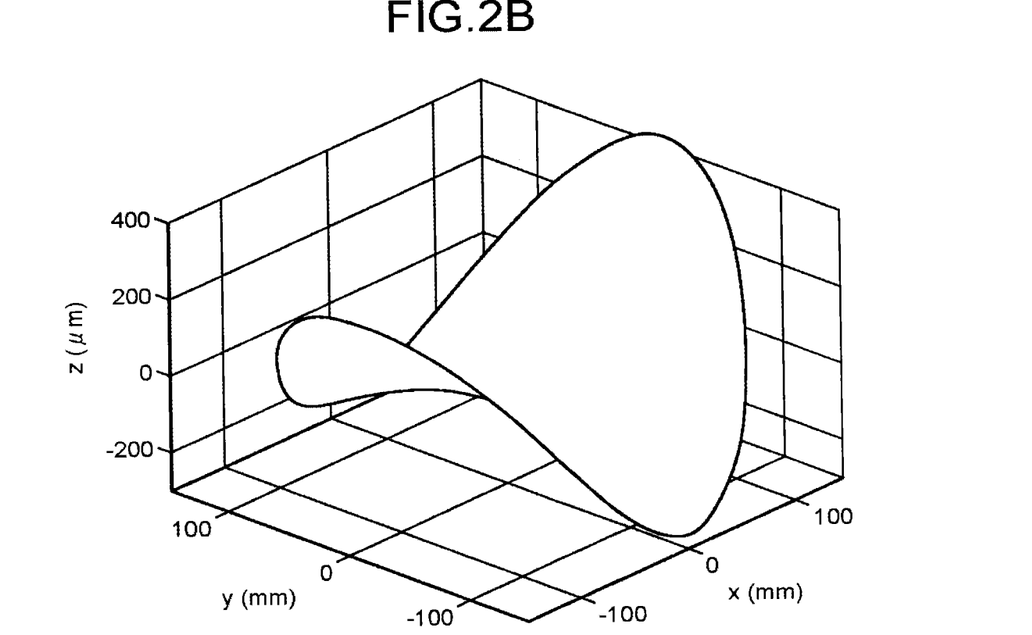
FIG. 2B is a view showing a measurement result of the warpage amount distribution of a wafer before heating in the embodiment.

In step S1, the shape of the wafer 1 before heating is measured. Specifically, along the front face 1a of the wafer 1 before heating, a warpage amount distribution is measured. For example, the warpage amount distribution can be measured by detecting displacements at a plurality of points on the front face 1a of the wafer 1 by use of a laser displacement gauge. The measurement result of the warpage amount distribution is three-dimensional information as shown in FIG. 2B, for example. FIG. 2B is a view showing a measurement result of the warpage amount distribution of the wafer 1 before heating.

In step S2, an information processing apparatus (such as a computer, not shown) performs simulation for estimating the shape of the wafer 1 after heating, based on the shape of the wafer 1 before heating, which has been measured in the step S1. The simulation for estimating the shape of the wafer 1 after heating is performed by use of each one of a plurality of heating patterns that are candidates for heating the wafer 1. Specifically, for a case where the thin film sheet 2 is attached onto the rear face 1b of the wafer 1 and then the wafer 1 is heated, the warpage amount distribution along the front face 1a of the wafer 1 estimated in this case is calculated. At this time, the configuration and properties of the thin film sheet 2 are already known.

Figure 3A:
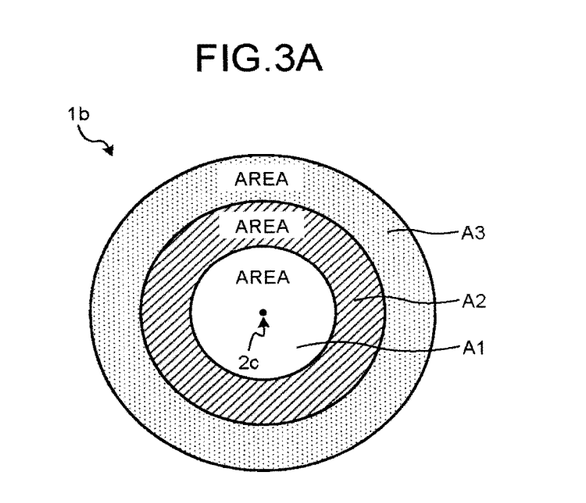
FIG. 3A is a plan view showing a configuration of a thin film sheet according to the embodiment.

The thin film sheet 2 is configured to be thermally shrinkable, and is coated with an adhesive agent (not shown) on its front face (attaching face). For example, as shown in FIG. 3A, the thin film sheet 2 has a size and shape corresponding to the wafer 1 to be attached to, and includes a plurality of areas A1 to A3. FIG. 3A is a plan view showing a configuration of the thin film sheet 2.

Figure 3B:
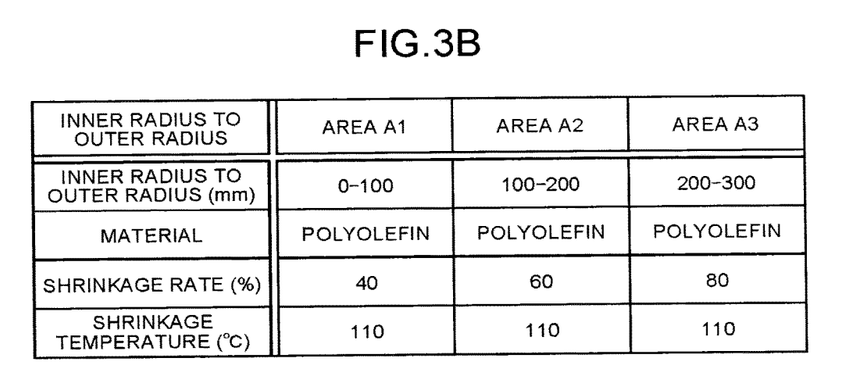
FIG. 3B is a view showing properties of the respective areas of the thin film sheet according to the embodiment.
Figure 3C:
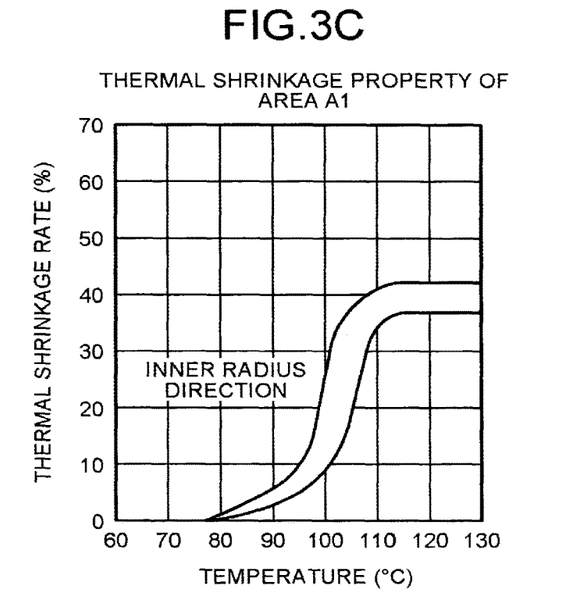
FIG. 3C is a view showing a property of an area A1 of the thin film sheet according to the embodiment.

As shown in FIG. 3A, the area A1 includes the center 2c of the thin film sheet 2, and, for example, has an almost circular shape with its center at the center 2c. For example, as shown in FIG. 3B, the area A1 has an almost circular shape with its radius of about 100 mm and with its center at the center 2c. FIG. 3B is a view showing properties of the respective areas A1 to A3 of the thin film sheet 2. The area A1 is made of a material containing, as its main component, one or more substances selected from the group including polyolefin, polyvinyl chloride, polyvinylidene fluoride, polyether ketone, ethylene propylene rubber, nitrile butadiene rubber, and silicone rubber. FIG. 3B is exemplified by a case where the area A1 is made of a material containing polyolefin as its main component. If the area A1 is made of a material containing polyolefin as its main component, the area A1 has a thermal shrinkage property shown in FIG. 3C, for example. FIG. 3C is a view showing the thermal shrinkage property of the area A1. In the case of the area A1 made of a material containing polyolefin as its main component, the area A1 causes thermal shrinkage with a thermal shrinkage rate of about 40% at a temperature of 110° C. or higher.

Figure 3D:
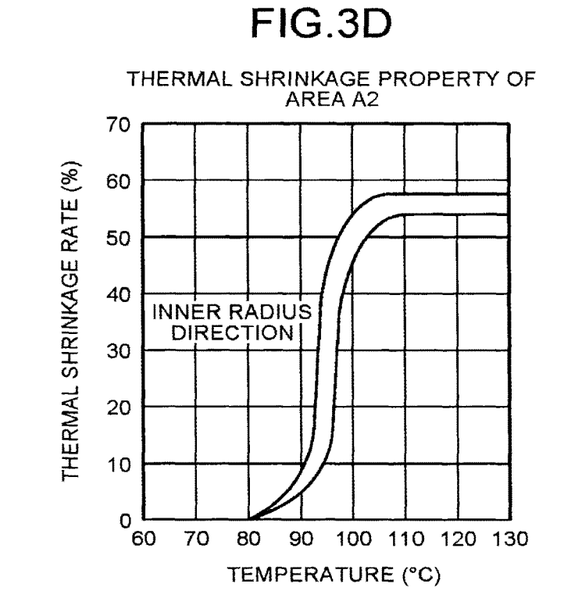
FIG. 3D is a view showing a property of an area A2 of the thin film sheet according to the embodiment.

As shown in FIG. 3A, the area A2 surrounds the area A1 from outside, when viewed in the plan view. The thermal shrinkage rate of the area A2 is larger than the thermal shrinkage rate of the area A1. The area A1 and the area A2 are almost concentric with each other. For example, as shown in FIG. 3B, the area A1 has an almost doughnut shape with an inner radius of about 100 mm and an outer radius of about 200 mm and with its center at the center 2c. The area A2 is made of a material containing, as its main component, one or more substances selected from the group including polyolefin, polyvinyl chloride, polyvinylidene fluoride, polyether ketone, ethylene propylene rubber, nitrile butadiene rubber, and silicone rubber. The area A1 and the area A2 contain, as their main component, a substance of the same kind as each other, but, for example, they have compositions different from each other (different in molecular weight), and so they are made of materials different in thermal shrinkage rate. FIG. 3B is exemplified by a case where both of the area A1 and the area A2 are made of materials containing polyolefin as their main component (wherein the molecular weight of the material of the area A1<the molecular weight of the material of the area A2). If the area A2 is made of a material containing polyolefin as its main component, the area A2 has a thermal shrinkage property shown in FIG. 3D, for example. FIG. 3D is a view showing the thermal shrinkage property of the area A2. In the case of the area A2 made of a material containing polyolefin as its main component, the area A2 causes thermal shrinkage with a thermal shrinkage rate of about 60% at a temperature of 110° C. or higher.

Figure 3E:
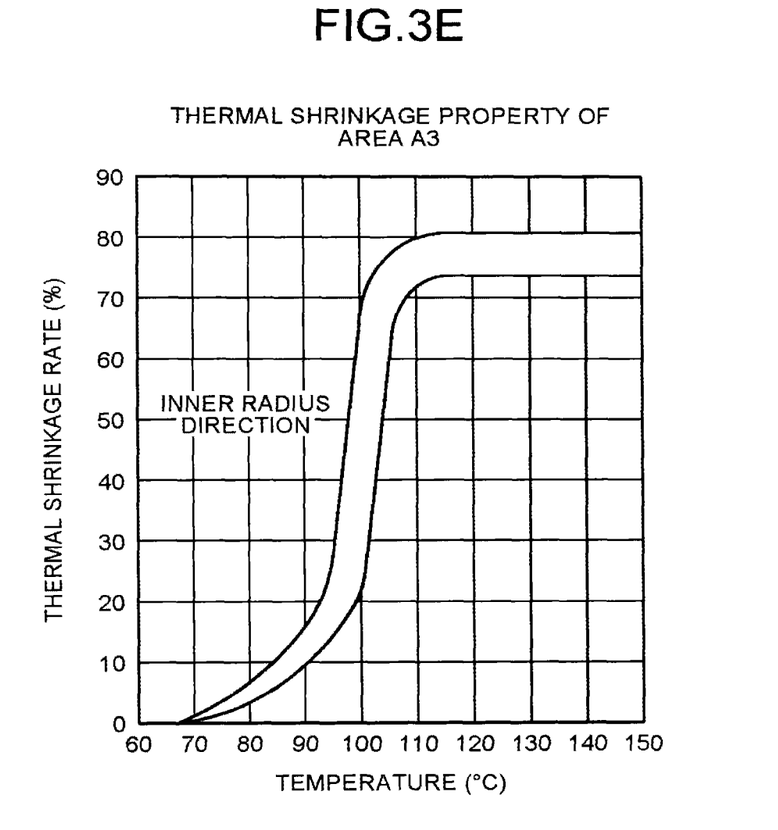
FIG. 3E is a view showing a property of an area A3 of the thin film sheet according to the embodiment.

As shown in FIG. 3A, the area A3 surrounds the area A2 from outside, when viewed in the plan view. The thermal shrinkage rate of the area A3 is larger than the thermal shrinkage rate of the area A2. The area A1, the area A2, and the area A3 are almost concentric with each other. For example, as shown in FIG. 3B, the area A3 has an almost doughnut shape with an inner radius of about 200 mm and an outer radius of about 300 mm and with its center at the center 2c. The area A3 is made of a material containing, as its main component, one or more substances selected from the group including polyolefin, polyvinyl chloride, polyvinylidene fluoride, polyether ketone, ethylene propylene rubber, nitrile butadiene rubber, and silicone rubber. The area A1, the area A2, and the area A3 contain, as their main component, a substance of the same kind as each other, but, for example, they have compositions different from each other (different in molecular weight), and so they are made of materials different in thermal shrinkage rate. FIG. 3B is exemplified by a case where all of the area A1, the area A2, and the area A3 are made of materials containing polyolefin as their main component (wherein the molecular weight of the material of the area A1<the molecular weight of the material of the area A2<the molecular weight of the material of the area A3). If the area A3 is made of a material containing polyolefin as its main component, the area A3 has a thermal shrinkage property shown in FIG. 3E, for example. FIG. 3E is a view showing the thermal shrinkage property of the area A3. In the case of the area A3 made of a material containing polyolefin as its main component, the area A3 causes thermal shrinkage with a thermal shrinkage rate of about 80% at a temperature of 110° C. or higher.

Coming back to FIG. 1, in step S3, the information processing apparatus determines a heating pattern to be used in step S5, in accordance with the simulation result of the step S2. Specifically, the information processing apparatus specifies a part to be heated of the wafer 1, in accordance with the warpage amount distribution estimated. The information processing apparatus determines the heating pattern to be used in the step S5, from the plurality of heating patterns used for the simulation in the step S2. For example, the information processing apparatus determines a heating pattern to be used in the step S5, such that the wafer 1 is deformed by the heating pattern to form a space 5 (see FIG. 4D) capable of realizing vacuum suction holding between the wafer and the surface 4a of the stage 4 when the wafer is mounted on the stage 4. The information processing apparatus determines a heating pattern to be used in the step S5, such that the wafer 1 provided with the thin film sheet 2 attached thereon is deformed into a shape such as a mountain shape by the heating pattern. The information processing apparatus determines a heating pattern to be used in the step S5, such that the wafer 1 provided with the thin film sheet 2 attached thereon is partly heated by the heating pattern, in which the heating amount applied to a portion larger in upward warpage amount measured in the step S1 is greater than the heating amount applied to a portion smaller in upward warpage amount measured in the step S1.

Figure 2C:
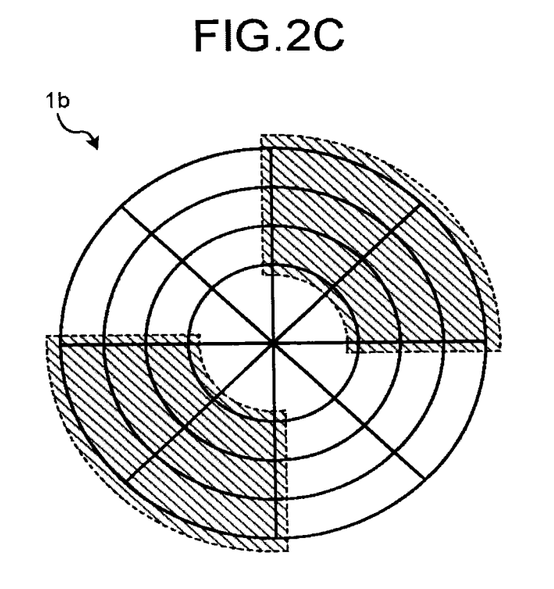
FIG. 2C is a view showing an example of a heating pattern used for simulation of the warpage amount distribution of a wafer after heating in the embodiment.
Figure 2D:
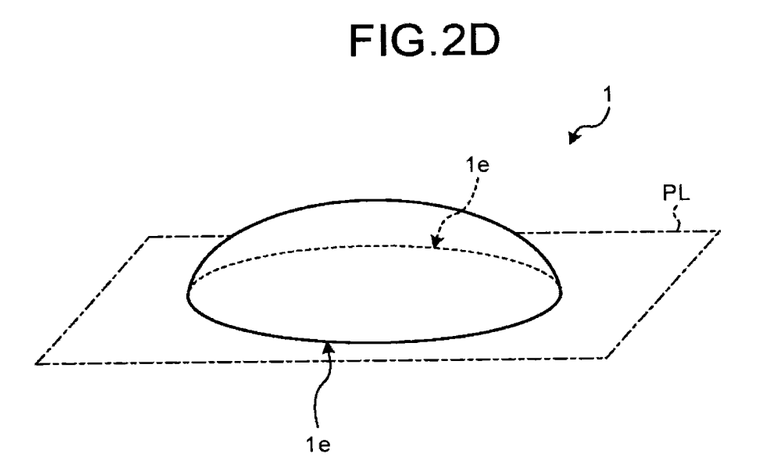
FIG. 2D is a view showing a simulation result of the warpage amount distribution of a wafer after heating in the embodiment.

For example, it is assumed that the rear face 1b of the wafer 1 is divided into regions, as indicated by solid lines shown in FIG. 2C, in terms of controllability of the on/off of heating. In a case where the shape (warpage amount distribution) of the wafer 1 before heating measured in the step S1 is in a state shown in FIG. 2B, when the regions with hatching shown in FIG. 2C are heated, for example, it can be estimated that the shape (warpage amount distribution) of the wafer 1 after heating comes into a mountain shape, as shown in FIG. 2D. FIG. 2D is a view showing a simulation result of the shape of the wafer 1 after heating. Specifically, as shown in FIG. 2D, in the shape of the wafer 1 after heating, if the end portion 1e of the wafer 1 is positioned near a virtual plane PL, it can be estimated that a space 5 (see FIG. 4D) capable of realizing vacuum suction holding is formed between the wafer and the surface 4a of the stage 4 when the wafer is mounted on the stage 4. In this case, the information processing apparatus can determine the heating pattern indicated with hatching in FIG. 2C, as a heating pattern to be used in the step S5.

Figure 4A:
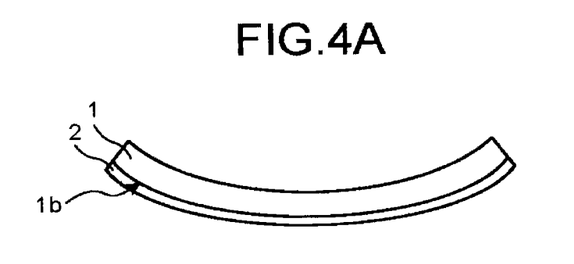
FIGS. 4A to 4E are sectional views showing steps of an exposure method according to the embodiment.

In step S4, the thin film sheet 2 thermally shrinkable is attached onto the rear face 1b of the wafer 1. For example, as shown in FIG. 4A, the thin film sheet 2 is uniformly attached onto the rear face 1b of the wafer 1. At this time, the thin film sheet 2 is attached onto the rear face 1b of the wafer 1, such that the center 2c of the thin film sheet 2 is positioned near the rear face center of the rear face 1b of the wafer 1.

In step S5, the wafer 1 provided with the thin film sheet 2 attached thereon is heated. The wafer 1 is entirely or partly heated, by controlling the shrinkage position, shrinkage shape, and shrinkage amount in the plane, to deform the wafer 1 into a shape projecting on the front face 1a side. The wafer 1 is heated such that a portion larger in warpage amount toward the front face 1a side is heated, and a portion smaller in warpage amount toward the front face 1a side is not heated, or alternatively it is heated for a shorter time or at a lower temperature.

Figure 4B:
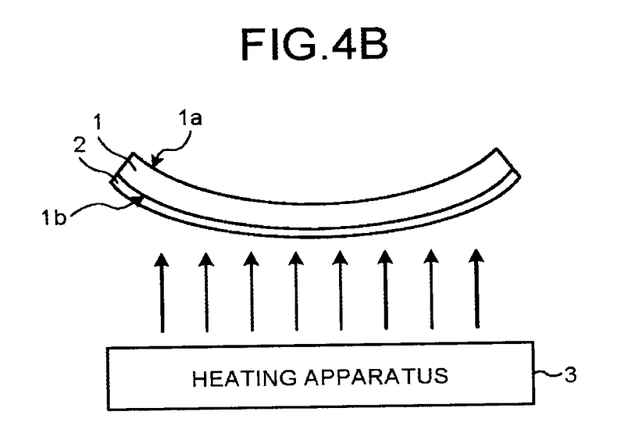

For example, as shown in FIG. 4B, a heating apparatus 3 is placed at the rear face 1b side of the wafer 1. The heating apparatus 3 includes a plurality of infrared ray generation sources (such as a plurality of infrared lamps) arranged in a two-dimensional state. The heating apparatus 3 is configured to control the on/off of a plurality of infrared ray generation sources independently of each other. The heating apparatus 3 acquires the heating pattern determined in the step S3. The information of the heating pattern may be received by the heating apparatus 3 from the information processing apparatus via a communication line, so that it is taken into the heating apparatus 3, or the information of the heating pattern may be read from the information processing apparatus to a recording medium, and then is read from the recording medium to the heating apparatus 3, so that it is taken into the heating apparatus 3.

Figure 4C:
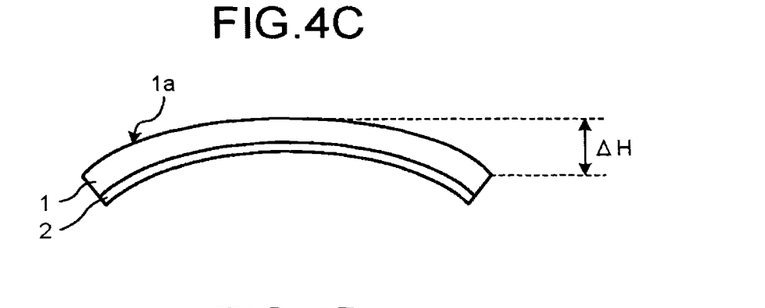

In accordance with the heating pattern thus acquired (such as the heating pattern shown in FIG. 2C), the heating apparatus 3 selectively turns on some infrared ray generation sources of the plurality of infrared ray generation sources. Consequently, in the rear face 1b of the wafer 1, the part specified in the step S3 is heated. For example, the heating apparatus 3 partly heats the wafer 1 provided with the thin film sheet 2 attached thereon, such that the heating amount applied to a portion larger in upward warpage amount measured in the step S1 is greater than the heating amount applied to a portion smaller in upward warpage amount measured in the step S1. Consequently, as shown in FIG. 4C, the wafer 1 is deformed into a shape projecting on the front face 1a side.

It should be noted that, the heating apparatus 3 may heat the wafer 1 from the front face 1a side, in place of the heating from the rear face 1b side. Further, the heating apparatus 3 may include a plurality of microwave generation sources in place of the plurality of infrared ray generation sources, and may heat the wafer 1 by dielectric heating in place of the infrared heating. Alternatively, the heating apparatus 3 may include a plurality of radio frequency generation sources in place of the plurality of infrared ray generation sources, and may heat the wafer 1 by induction heating in place of the infrared heating.

In step S6, the shape of the wafer 1 after heating is measured. Specifically, along the front face 1a of the wafer 1 after heating, a warpage amount distribution is measured. For example, the warpage amount distribution can be measured by detecting displacement at a plurality of points on the front face 1a of the wafer 1 by use of a laser displacement gauge. The measurement result of the warpage amount distribution is three-dimensional information (see FIG. 2D), for example.

In step S7, a judgment is made as to whether or not the shape of the wafer 1 after heating satisfies a criterion. For example, the information processing apparatus acquires the measurement result of the warpage amount distribution of the wafer 1 after heating, calculates the difference H between the highest point and the lowest point on the front face 1a of the wafer 1, and compares the difference ΔH with a threshold value Hth. For example, the threshold value Hth is set at about 150 μm. If the difference ΔH is not larger than the threshold value Hth, the information processing apparatus regards the shape of the wafer 1 after heating as satisfying the criterion ("OK" at the step S7), and causes the sequence to proceed to step S8. If the difference ΔH is larger than the threshold value Hth, the information processing apparatus regards the shape of the wafer 1 after heating as not satisfying the criterion ("NG" at the step S7), and causes the sequence to return to the step S3, so as to perform heating by use of another heating pattern.

In the step S8, the wafer 1 after heating, i.e., the wafer 1 deformed in a shape projecting on the front face 1a side is mounted on the surface 4a of the stage 4 of the exposure apparatus.

Figure 4D:
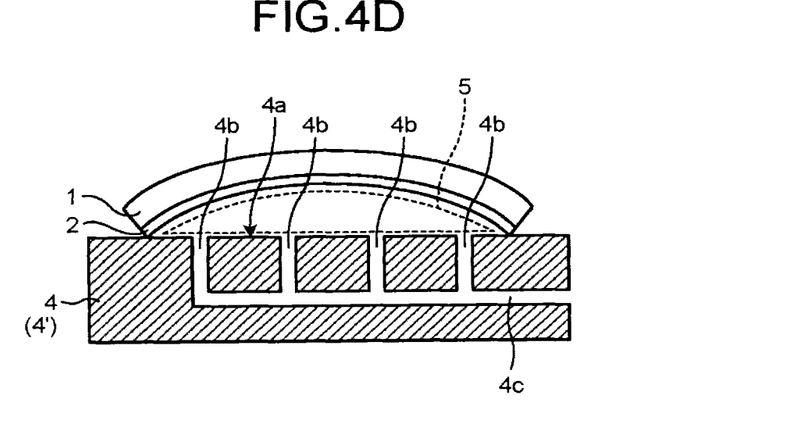

For example, as shown in FIG. 4D, the surface 4a of the stage 4 is provided with a plurality of vacuum suction holes 4b. The vacuum suction holes 4b are connected to a vacuum apparatus (not shown) respectively through communication passages 4c, so that they can be subjected to vacuum exhaust by the vacuum apparatus. At this time, a space 5 capable of realizing vacuum suction holding is formed between the wafer 1 provided with the thin film sheet 2 attached thereon and the surface 4a of the stage 4.

Figure 4E:
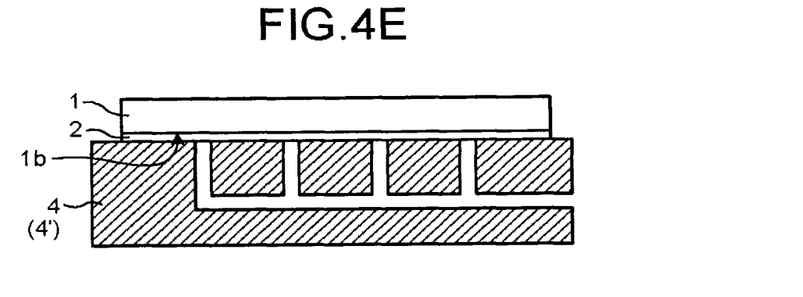

Accordingly, when the vacuum apparatus performs vacuum exhaust to the respective vacuum suction holes 4b, the rear face 1b side of the wafer 1 is held on the surface 4a of the stage 4 by vacuum suction, as shown in FIG. 4E. In this case, the wafer 1 is fixed on the stage 4 by vacuum suction holding from the rear face 1b side, and so the wafer 1 is held in a flat state.

In step S9, the exposure apparatus performs an exposure process to the wafer 1 under a state where the wafer 1 is held in a flat state on the stage 4. Here, the exposure apparatus may perform a post baking process after the exposure, as needed. After the exposure process is completed, a conveyor system conveys the wafer 1 subjected to the exposure, from the exposure apparatus to a development apparatus.

In step S10, the wafer 1 deformed in a shape projecting on the front face 1a side is mounted on the surface 4a of a stage 4' of the development apparatus. It should be noted that, although FIGS. 4D and 4E are views showing a state where the wafer 1 is mounted on the stage 4 of the exposure apparatus, they are diverted as views showing a state where the wafer 1 is mounted on the stage 4' of the development apparatus.

For example, as shown in FIG. 4D, the surface 4a of the stage 4' is provided with a plurality of vacuum suction holes 4b. The vacuum suction holes 4b are connected to a vacuum apparatus (not shown) respectively through communication passages 4c, so that they can be subjected to vacuum exhaust by the vacuum apparatus. At this time, a space 5 capable of realizing vacuum suction holding is formed between the wafer 1 provided with the thin film sheet 2 attached thereon and the surface 4a of the stage 4.

Accordingly, when the vacuum apparatus performs vacuum exhaust to the respective vacuum suction holes 4b, the rear face 1b side of the wafer 1 is held on the surface 4a of the stage 4 by vacuum suction, as shown in FIG. 4E. In this case, the wafer 1 is fixed on the stage 4 by vacuum suction holding from the rear face side, and so the wafer 1 is held in a flat state.

In step S11, the development apparatus performs a development process to the wafer 1 under a state where the wafer 1 is held in a flat state on the stage 4. After the development process is completed, a conveyor system conveys the wafer 1 subjected to the development, from the development apparatus to a stripping apparatus.

In step S12, the stripping apparatus strips the thin film sheet 2 from the rear face 1b of the wafer 1. For example, the wafer 1 provided with the thin film sheet 2 attached thereon is immersed in a stripping liquid, such as thinner or SH (mixture liquid of sulfuric acid and hydrogen peroxide), for a predetermined time. Consequently, the wafer 1 is obtained in a state from which the thin film sheet 2 has been removed.

As described above, according to this embodiment, when an exposure process is performed, the thin film sheet 2 thermally shrinkable is attached onto the rear face 1b of the wafer 1 and then the wafer 1 is heated, so that the wafer 1 is deformed into a shape projecting on the front face 1a side. Then, the wafer 1 thus deformed is fixed onto the stage 4 by vacuum suction holding from the rear face 1b side. Consequently, the wafer 1 is held in a flat state, which makes it possible to prevent such a pattern formation failure that the mask pattern image is difficult to be focused on the front face of the wafer 1. Further, in the exposure process, the planar uniformity of exposure amount can be easily improved, and the overlay accuracy between layers can be easily improved.

Further, according to this embodiment, the thin film sheet 2 includes the area A1 and the area A2, wherein the area A2 surrounds the area A1 from outside and has a thermal shrinkage rate larger than that of the area A1. Consequently, when the thin film sheet 2 is attached onto the rear face 1b of the wafer 1 and then the wafer 1 is heated, the wafer 1 is deformed into a shape projecting on the front face 1a side.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure method comprising:
    attaching a thin film sheet onto a rear face of a wafer with an adhesive agent therebetween, the thin film sheet being configured to be thermally shrinkable, the thin film sheet having a thermal shrinkage rate that increases from inside to outside in a concentric state and having a thermal shrinkage rate larger than the wafer;
    heating the wafer provided with the thin film sheet attached thereon according to a heating pattern that the wafer provided with the thin film sheet attached thereon is deformed into a mountain shape, the heating pattern including a heating area and a heating amount, the heating area indicating which area is to be heated in an entire area of the wafer;
    fixing the deformed wafer onto a stage by vacuum suction holding from a rear face side of the wafer; and
    performing exposure, to light, on a front face of the wafer fixed on the stage.

2. The exposure method according to claim 1, wherein the deforming includes deforming the wafer provided with the thin film sheet attached thereon, such that a space capable of realizing vacuum suction holding is formed between the wafer and a surface of the stage when the wafer is mounted on the stage.

3. The exposure method according to claim 1, wherein the attaching includes attaching the thin film sheet, which includes a first area and a second area such that the second area surrounds the first area from outside and has a thermal shrinkage rate larger than that of the first area, onto the rear face of the wafer.

4. The exposure method according to claim 1, wherein the attaching includes attaching the thin film sheet, which includes a first area, a second area, and a third area such that the second area surrounds the first area from outside and has a thermal shrinkage rate larger than that of the first area, and the third area surrounds the second area from outside and has a thermal shrinkage rate larger than that of the second area, onto the rear face of the wafer.

5. The exposure method according to claim 1, wherein the heating includes partly heating the wafer provided with the thin film sheet attached thereon with a plurality of heat generation sources arranged in a two-dimensional state along the front face of the wafer, according to the heating pattern.

6. The exposure method according to claim 5, further comprising:
estimating a warpage amount distribution of the wafer after heating performed by each one of a plurality of heating patterns different from each other; and
specifying a part to be heated of the wafer to determine the heating pattern, in accordance with the estimated warpage amount distribution,
wherein the heating includes selectively heating the specified part of the wafer provided with the thin film sheet attached thereon according to the determined heating pattern.

7. The exposure method according to claim 6, further comprising:
measuring a warpage amount distribution of the wafer before the heating,
wherein the estimating includes estimating a warpage amount distribution of the wafer after the heating, in accordance with the measured warpage amount distribution.

8. The exposure method according to claim 7, wherein the heating includes partly heating the wafer provided with the thin film sheet attached thereon, such that heating amount applied to a portion larger in the measured upward warpage amount is greater than heating amount applied to a portion smaller in the measured upward warpage amount.

9. The exposure method according to claim 8, further comprising:
measuring a warpage amount distribution of the wafer after the heating,
wherein the vacuum suction holding includes holding the deformed wafer, from the rear face side by vacuum suction, when the measured warpage amount distribution satisfies a criterion.

10. The exposure method according to claim 1, further comprising:
stripping the thin film sheet attached on the wafer, from the wafer, after the exposure.

11. A manufacturing method of a device, the method comprising:
performing an exposure, to light, on a wafer by use of the exposure method according to claim 1 to form a latent image on the wafer; and
performing a development of the latent image formed on the wafer.

* * * * *